(12) United States Patent
Tishin et al.

(10) Patent No.: US 8,378,877 B2
(45) Date of Patent: Feb. 19, 2013

(54) POROUS MATERIALS EMBEDDED WITH NANOPARTICLES, METHODS OF FABRICATION AND USES THEREOF

(76) Inventors: Aleksandr Mettalinovich Tishin, Moscow (RU); Samed Veisalkara Ogly Halilov, Moscow (RU)

( * ) Notice: Subject to any disclaimer, the term of this patent is extended or adjusted under 35 U.S.C. 154(b) by 314 days.

(21) Appl. No.: 12/789,460

(22) Filed: May 28, 2010

(65) Prior Publication Data

US 2010/0231433 A1 Sep. 16, 2010

Related U.S. Application Data

(63) Continuation-in-part of application No. PCT/RU2008/000813, filed on Dec. 29, 2008.

(51) Int. Cl.
*H01Q 17/00* (2006.01)
*H01Q 15/00* (2006.01)
(52) U.S. Cl. ..................... 342/1; 342/4; 342/5
(58) Field of Classification Search .............. 342/1–4, 342/5–12, 175
See application file for complete search history.

(56) References Cited

U.S. PATENT DOCUMENTS

| | | | |
|---|---|---|---|
| 6,229,500 B1 | 5/2001 | Caille et al. | |
| 6,249,261 B1 | 6/2001 | Solberg, Jr. et al. | |
| 6,271,793 B1 | 8/2001 | Brady et al. | |
| 6,406,783 B1 | 6/2002 | Phillips et al. | |
| 6,788,273 B1 | 9/2004 | Schultz et al. | |
| 7,794,629 B2 * | 9/2010 | Youngs | 252/512 |
| 2002/0049276 A1 | 4/2002 | Zwick et al. | |
| 2003/0096104 A1 | 5/2003 | Tobita et al. | |
| 2004/0164293 A1 * | 8/2004 | Maloney et al. | 257/40 |
| 2004/0227687 A1 * | 11/2004 | Delgado et al. | 343/872 |
| 2006/0257090 A1 | 11/2006 | Podolsky et al. | |
| 2007/0194298 A1 * | 8/2007 | Dukovski et al. | 257/15 |
| 2010/0231433 A1 * | 9/2010 | Tishin et al. | 342/1 |

FOREIGN PATENT DOCUMENTS

| | | | |
|---|---|---|---|
| FR | 2048045 | | 3/1971 |
| GB | 2460064 A | * | 11/2009 |
| JP | 2004182545 | | 7/2004 |
| WO | 2007023118 | | 3/2007 |
| WO | WO 2009091292 A2 | * | 7/2009 |

OTHER PUBLICATIONS

Barthell, Barry L.; Duchane, David V.; , "Vacuum deposition of high quality metal films on porous substrates," Journal of Vacuum Science and Technology , vol. 20, No. 4, pp. 1341-1344, Apr. 1982.*
Yu Hao; Tian Jiang; Yijun Feng; , "Microwave absorbing screens based on multilayered Fe nanofilms," Microwave Conference Proceedings (APMC), 2010 Asia-Pacific , vol., No., pp. 171-174, Dec. 7-10, 2010.*
Jerzy Kaleta; Daniel Lewandowski: "Inelastic properties of magnetorheological composites: I. Fabrication, experimental tests, cyclic shear properties" Smart Materials and Structures, IOP Publishing Ltd., Bristol, GB, vol. 16, No. 5, Oct. 1, 2007, pp. 1948-1953, XP020120609 ISSN: 0964-1726 Magnetorheological composite—structure paragraph [0002].

* cited by examiner

*Primary Examiner* — John B Sotomayor (57) ABSTRACT

The present invention relates to porous structures embedded with nanoparticles, methods of forming the structures, and methods of using the structures. In most general form, the invention relates to porous materials embedded with nanoparticles having characteristics, such as magnetic, enabling to align or arrange the nanoparticles in the material by exposure, e.g. to a magnetic field. Therefore, a method according to the invention provides manufacturing materials having variable magnetic and electromagnetic properties which can be adapted during manufacture for various applications, such as electromagnetic wave absorbers, lens, concentrators, etc.

14 Claims, 2 Drawing Sheets

POROUS MATERIALS EMBEDDED WITH NANOPARTICLES, METHODS OF FABRICATION AND USES THEREOF

CROSS-REFERENCES TO RELATED APPLICATIONS

This application claims the benefits from International Application PCT/RU2008/000813 filed on Dec. 29, 2008 and priority application RU 2007149614 filed on Dec. 28, 2007. The contents of these applications are hereby incorporated by reference and in their entirety.

FIELD OF THE INVENTION

The present invention relates to porous structures embedded with nanoparticles, methods of forming the structures and uses thereof. In most general form, the invention relates to porous polymer materials embedded with nanoparticles having characteristics, such as magnetic, enabling to align or arrange the nanoparticles in the material by exposure, e.g. to lines of magnetic force. Therefore, a method according to the invention provides manufacturing materials having variable magnetic and electromagnetic properties which can be adapted for various applications, such as electromagnetic wave absorbers, wave lens, concentrators and similar devices.

BACKGROUND OF THE INVENTION

The increased variety and sophistication of devices employed in telecommunication industry has served to highlight the need to provide devices capable of interacting with electromagnetic waves, such as lightweight antennas, lens, absorbers, concentrators, and so on. This need is especially critical with respect to the low frequency band of the electromagnetic spectrum, such as radio frequency, and over a broad band of other frequencies, typically ranging from 100 KHz to 100 GHZ.

It will be desirable therefore to design a material which, during initial manufacture, can be optimized for a particular application and wave frequency, especially, low frequency suitable for radio transmission. While such broadband absorbers and antennas have hitherto been produced, they are typically quite bulky, heavy, and generally ill-suited for operational use in those situations where low bulk and light weight are of paramount importance. Furthermore, even with absorbers satisfying both low bulk and low weight requirements, it often turns out that the absorber construction is so complex as to render impractical its production in an economical manner.

Thus, bulk absorbers are commonly used for absorbing radiation. A bulk absorber has varying particle concentrations throughout the absorber, which alter the dielectric or magnetic properties of the absorber. The particle concentrations can be designed to absorb target waves, depending on the application.

McDonnell Douglas Helicopter, Co, U.S. Pat. No. 6,406,783 A, 18.06.02 describe a bulk radiation absorber having altered dielectric or magnetic properties, and more specifically, bulk absorbers with predetermined concentration gradients. The particle concentrations can be selected to absorb target waves, depending on the application. The bulk absorber comprises particles dispersed throughout the matrix in a substantially continuous concentration gradient. The particles have dielectric or magnetic altering properties. The particles may be carbon fibers, coated hollow microspheres, carbon black, carbon whiskers, or a combination thereof. The matrix may comprise foam materials or ceramic materials. The foam material may be syntactic or blown foam, and may be thermoplastic or thermoset.

Another area of practical interest for potential application of materials embedded with nanoparticles includes lens, antennas and concentrators.

Described by Raytheon Company; U.S. Pat. No. 6,788,273; 07.09.2004 is a compensated radome, comprising an inner layer of a negative index of refraction material, often referred to as a "metamaterial", and an outer layer of a positive index of refraction material. The thickness of the two materials and their respective refractive indices are adjusted so that a beam of light passing through the radome is effectively not refracted. The metamaterial-compensated radomes solve the bore sight angle problem with a minimum of complexity. Disclosed by Alcatel, U.S. Pat. No. 6,229,500, 08.05.01 is a multilayer focusing spherical lens adapted to be mounted in a transceiver antenna device of a terminal of a remote transceiver system and having a concentric focal sphere, the lens including a central layer and a peripheral layer having different dielectric constants, each dielectric constant value being determined so that the lens focuses parallel microwave beams towards the focal sphere concentric with the lens.

Disclosed by Southwest Research Institute, U.S. Pat. No. 6,249,261, 19.06.01 is the direction-finding antenna constructed from polymer composite materials which are electrically conductive, with the polymer composite materials replacing traditional metal materials. An inherent advantage of replacing metal materials is significantly lower radar reflectivity (radar cross section) and lower weight. The reduced radar reflectivity reduces the range of detectability of the antenna by possible adversaries. Despite significantly lower radar reflectivity, the antenna assembly has direction-finding characteristics which are essentially equivalent to traditional metal antennas.

Disclosed by International Business Machines Corporation, U.S. Pat. No. 6,271,793, 07.08.01 is the RF antenna made from a composite material, wherein the composite material preferably comprises electrically conducting particles in a matrix, and wherein the electrically conducting particles have such a high density that the electrical conductivity of the composite material is large enough for the antenna to receive RF signals sufficient to activate the RF tag.

There are numerous disadvantages to the prior art bulk absorbers, lens and concentrators with a discontinuous dielectric or magnetic altering property gradient. The discontinuities in these materials, due to the step-wise changes in the dielectric or magnetic altering property gradient, cause deflection or reflection of the waves that are meant to be focused or, opposite, absorbed. Additionally, the bond layer in between the adjacent billets also causes possible deflection or reflection of the waves.

Lately, various novel methods of manufacturing composite lightweight materials useful as a waveguide, lens or wave absorbers were reported.

Thus, disclosed by FDC Corporation, JP2004182545; 02.07.2004 is a method of manufacturing porous ferrite by which firing free from breaking or crack is carried out and vacancy is properly formed in a sintered compact and a radio wave absorber having radio wave absorption characteristic capable of making frequency high and wide by making porous and having excellent mechanical strengths and weather resistance. The method of manufacturing the porous ferrite is performed by measuring ferrite powder of a base material, previously firing at a prescribed temperature, pulverizing the previously fired body and granulating, mixing a fine organic material particle and a thermoplastic powder having low melting point and binder function with the previously fired ferrite powder, molding and firing to eliminate the additive components to obtain the porous sintered compact. The organic material particle (starch) and the thermoplastic powder (paraffin fine particle) are added by 0-30 wt. % in total and the mixing ratio of the organic material particle is increased in a ratio ranging from 0 to 5 wt. % with the increase of the thermoplastic powder. When the thickness of a sample (d) is 0.8 cm, the return loss in about 100-750 MHz is $\geq$20 dB to cope with VHF-UHF whole band.

As ferrite fine particles may be used magnetic fine particles, such as a NiZn system, a MgZn system, and a MnZn system.

Disclosed by Viktor A. Podolsky and Evgueni E. Narimanov; US 2006/0257090; 16.11.2006 is a waveguide structure comprising a first and a second waveguide border elements having substantially planar surfaces and a core material therebetween having a positive in-plane dielectric constant and a negative perpendicular-to-plane dielectric constant, wherein the waveguide structure exhibit a negative index of refraction for electromagnetic radiation in a frequency range, such as from 1 GHz to 1 mln GHz or in the wavelength range of about $1\times10^{-7}$ Hz to $1\times10^{-1}$ m. The core material can comprise inclusions having a negative dielectric constant embedded in a host material having a positive dielectric constant. The inclusions can be distributed substantially homogenously in a host medium. In addition to the embodiments described above having nanowires embedded in a dielectric host, other composites having inclusions embedded in a host material can be used to achieve the desired left-handed optical characteristics. For example, randomly distributed inclusions (e.g., nanoparticles) with a negative dielectric constant and having a variety of shapes can be embedded into a transparent dielectric host having a positive dielectric constant. The negative e in these embodiments can be achieved both in optical and infrared frequency ranges by using plasmonic (e.g., Ag, Au, and the like) or polar (e.g., SiC, and the like) materials to at least partially form the inclusions.

Paul D. Zwick, in US 2002/0049276, 25.04.2002 describes thermoplastic elastomer gel composition and method of making same. The thermoplastic elastomer gel composition can comprise a variety of magnetic additives. Typically, these additives are ferrite complexes, which when charged or energized by another strongly magnetic force, will become magnetic or dipolar and yield magnetic fields. Strontium and Barium Ferrite are the most common commercially used ferrites, but other ferrites can also be used. The magnetic additives require additional manufacturing steps. Specifically, after being formed or extruded the gel containing the magnetic ingredients should be oriented through a powerful magnetic field. However, specific details of how the orientation can be implemented are not disclosed.

Therefore, it would be advantageous to obtain a low bulk lightweight material having properties which can be modified during manufacture targeting a specific application in a particular waveband range.

Further, there would be advantageous to obtain a low bulk lightweight material fabricated such as to reduce the wave distortions due to discontinuous dielectric or magnetic property gradients.

In view of the foregoing, it is an object of the present invention to provide an electromagnetic radiation absorber having both low bulk and low weight.

A still further object of the present invention is to provide an electromagnetic radiation absorber useful for dissemination of electromagnetic radiation of a given waveband range.

Yet another object of the present invention is to provide an electromagnetic radiation absorber which is sufficiently flexible and if desired, can be configured during manufacture around the object to assume the contours of the object.

A still further object of the present invention is to provide an electromagnetic radiation absorber which may be molded or otherwise shaped to permanently assume virtually any predetermined geometrical configuration.

A still further object of the present invention is to provide an electromagnetic radiation absorber which is useful over a relatively large portion of the electromagnetic radiation spectrum, which is of simplified construction, easy to produce and which is adapted for manufacture in an economical manner.

Another object of the present invention is to provide a simplified method for producing an electromagnetic radiation absorber which satisfies the above-stated general objects and others.

BRIEF SUMMARY OF THE INVENTION

A. A Porous Magnetic Material

In order to achieve the above and other objectives of the invention, a material is provided comprising a porous substrate and particles dispersed throughout the substrate with a predetermined concentration gradient or to form a three-dimensional structure having parameters and shape, which can be preset or modified in the process of manufacture by exposure to magnetic or electromagnetic radiation.

The particles have specific electric or magnetic properties and thus, by incorporating these particles in the material, one can alter the respective electric and magnetic characteristics of the obtained composite material. The particles may be magnetic powders with particle size from 1 nm to 10 microns consisting of Fe, Co, Ni, Cr, rare-earth and other metals, various ferrites, such as ferrites of type $MFe_2O_4$ (where M=Mn, Ni, Cu), Ni—Zn ferrite, barium hexaferrite, other ferrites, iron-nickel alloys, iron-cobalt alloys, alloys based on rare-earth metals Nd—Fe—B, Sm—Co; Fe—B—Co—R (where R is a rare-earth element), or a combination thereof.

According to one aspect of the invention, an article is provided comprising a polymer substrate having a porous structure, and embedded in the said polymer substrate particles of magnetic or dielectric material having a diameter in the range of about 1 nanometer to 100 micron, wherein the particles are magnetically, electrically or electromagnetically aligned to form within the substrate a predetermined three-dimensional structure having at least one characteristic dimension or a range of characteristic dimensions proportional to at least one characteristic parameter of the said magnetic, electric or electromagnetic radiation.

In one embodiment of the invention, the said characteristic parameter is the direction of the magnetic force lines.

In another aspect of the invention, the said characteristic parameter is the wave length or wave length range of the applied magnetic or electromagnetic field, wherein the obtained article exhibit the properties specific for this particular wave length or wave length range.

In one embodiment, the said particles are embedded in the substrate material so that they have increased concentration within the vicinity of the pore surface and/or are embedded in pore walls, or deposited onto pores of the substrate. In another embodiment, the particles or structures formed thereof are dispersed throughout the substrate in a predetermined substantially continuous concentration gradient.

In one embodiment, the particles are aligned to form a predetermined pattern or structure as defined by the geometry of electric, magnetic or electromagnetic field it is subjected in the process of manufacture.

Preferably, the particle size ranges from 3 nm to 27 nm. Preferably also, the particles are made of at least one of magnetic and dielectric material.

In one embodiment, the particles are made of a magnetocaloric material.

Magnetocaloric effect is the change in a temperature of a magnet material when it is subjected to magnetization in the external magnetic field or it is demagnetized in adiabatic conditions (i.e. in the absence of heat exchange with the ambient medium). Magnetocaloric effect is due to re-distribution of the intrinsic energy of a magnetic substance between the system of its magnetic moments and its crystalline lattice. Magnetocaloric effect reaches its maximal value at magnetic phase transfer temperature, e.g. around Curie point for ferromagnetic substances. The application of magnetic field causes heating of ferromagnetic substance, while the removal of the field will cause its cooling. One of the most notable examples of the magnetocaloric effect is in the chemical element gadolinium and some of its alloys. Gadolinium's temperature is observed to increase when it enters certain magnetic fields, e.g. when the change is around 1 Tesla, the increase can reach 3 degrees. When it leaves the magnetic field, the temperature returns to normal. The effect is considerably stronger for the gadolinium alloy $Gd_5(Si_2Ge_2)$.

In one example embodiment, the magnetic material is selected from the group consisting of iron, cobalt, nickel, chromium, dysprosium, gadolinium, or a combination thereof.

In one example embodiment the magnetic material is selected from the group consisting of rare-earth and other metals, various ferrites, such as ferrites of type $MFe_2O_4$ (where M=Mn, Ni, Cu), Ni—Zn ferrite, barium hexaferrite, other ferrites, iron-nickel alloys, or a combination thereof. In another example embodiment, the magnetic material additionally comprises as a supplemental metal a transition metal, such as selected from the group consisting of Ti, Sc, V, Cr, Mn, Cu, Zn, Y, Zr, Nb, Mo, Ru, Pd, Ag, Cd, Hf, Ta, W, Re, Os, Ir, Pr, U, and Hg.

In one example embodiment dielectric material is selected from the group consisting of Sn, Ga, Ge, In, Sb, As, Ga, Bi, Mg, Ba, Ca, Sr, and Be.

According to the invention, the particles are in the form of nano-fibers, nano-spheres, nano-ovals, nanowire, etc.

In one example embodiment, the porous substrate is a foam polymer material, or a ceramic material. The porous polymer can be syntactic or blown foam, and the polymer can be a thermoplastic or thermo-reactive polymer. In another example embodiment, the porous substrate is a porous ceramic material.

Nano-particles embedded in the porous substrate, when subjected to magnetic field of a certain geometry and energy, form structures having the desired properties providing certain wave permeability and absorbance. The process according to the invention provides control the pore dimensions so that the foaming process can be modified depending on the certain filed of application of the articles obtained by the process.

In one example embodiment, the obtained article can be used as a wave absorber.

In one example embodiment, the material is intended for use as a radio frequency lens.

In one example embodiment, the article can be used as antenna concentrator. In one example embodiment, the material is used as a low frequency lens.

In one example embodiment, the material is a meta-material. The porous matrix may comprise foam polymer materials or ceramic materials. The foam material may be syntactic or blown foam, and may be thermoplastic or thermoset. The particles embedded in a porous matrix form a pattern upon subjection to electromagnetic field of a certain geometry and power, so as to provide specific wave propagation or absorption properties. The invention process permits a degree of control over the range of pore sizes so that the foams may be custom-tailored for specific applications.

Conventional foams, produced by traditional methods of foam formation, have voids or pores ranging from 50 to 100 microns in diameter. By some definitions, microcellular foams are those containing cells less than 50 microns in diameter. According to the invention, both types of materials referred to as microcellular foams and conventional foams containing voids or pores of varying geometries are suitable for various applications as described in the invention. Especially preferable foams that contain pores or voids with dimensions of from about 1 to about 400 microns, most preferably from about 5 to about 200 microns.

Foams according to the invention may be made from suitable organic polymeric materials, including thermoplastic polymers, such as polyamides, polyesters, and polyolefins. Other suitable polymers include poly(dioxanone), polyglycolic acid, polylactic acid, polyalkylene oxalates and copolymers thereof.

The said porous substrate can be prepared of a foam material made of a polymer selected from polyolefins, polydienes, polyesters, polyamides, vinyl polymers, ionomers, acrylic acid polymers, polyacrylates, polysulphonates, polyphenylenoxides, polyacetals, silicone polymers, thermoplastic polyuretans, thermoplastic polyimids, polyketons, phenolic acid apolymers, melamine resins, epoxy resins, saturated polyesters, thermosetting polyurethanes, co-polymers and halogen-containing derivatives thereof, formed polyurethanes, foamed polystyrenes, polyvinylchlorides, and other foamed materials obtained using conventional techniques and traditional foaming agents, including physical and chemical foaming agents, as well as catalysts, plasticizing agents, and so on.

The examples of foam materials include: foam polystyrene (PSV), polyurethanes, such as PPU 210, PPU 205-5, obtained of ethers (lacrols) and polyisocyanates, polyesters such as PPU-E, polyvinylchloride foam materials, such as PVC-1, vinypore, porous polyethylenes, such as PPE-2, PPE-3, epoxy resorcine resins such as PEN-I and other. These types of foam materials are well known for a specialist in the art and are described, such as in "PENOPLASTY, IKH SVOISTVA AND PRIIVIENINIE V PROMYSHLENNOSTI, LENINGRAD, 1980; VSPENENNYE PLASTICHESKIE MASSY, M, VNIISS, 1983; BERLIN AA, ET AL, KHIMIYA I TEKHNOLOGIYA GASONAPOLNENNYKH VUSOKOPOLYMEROV, V. 3, SYU 910676, SU 1735323, SU 689062, SU 618050, SU 459-482 etc.

The foaming agents which can be used for preparing solid and liquid magnetic foams can be selected among physical foaming agents, such as CO2, NH3, freon, and other gaseous volatiles, aliphatic and halogenated hydrocarbons, low boiling point alcohols, ethers, ketons; chemical foaming agents, such as substances, producing gaseous products as a result of thermal decomposition (such as ammonium salts of mineral and organic acids, hydrocarbonates and carbonates of rare-earth and earth metals, azo- and diazo-compounds, such as azodicarbonamide, and others.

Methods of Preparing a Porous Magnetic Material

The objects of the invention are further attained by a method of fabricating a porous lightweight structure embedded with nanoparticles, the method comprising the steps of:
providing a precursor of a porous lightweight structure,
providing nanoparticulate magnetic material,
combining the precursor of a porous structure with nanoparticulate magnetic material under conditions allowing to form a dispersion of the said nanoparticulate material in the said precursor of a porous structure;
placing the obtained dispersion of nanoparticles in the said polymer precursor in a molding form;
subjecting the dispersion to magnetic or electromagnetic field to provide nanoparticulate material dispersed within the porous structure to form a three-dimensional structure exhibiting the desired electric, magnetic or electromagnetic parameters;
while simultaneously or subsequently subjecting the structure formed thereby to conditions providing consolidation of the porous structure with nanoparticulate three-dimensional structure embedded therein.

In particular, nanoparticles can be subjected to electromagnetic field forcing the nanoparticles to form continuous electroconductive lines of certain geometry within said porous structure.

Optionally, the method according to the invention comprises additional step of subsequent coating of the obtained structures by a lightweight foam to prevent fragile structures from ruptures and increase the durability of the formed three-dimensional structures for further use in practice.

In one embodiment, a method of fabricating porous structures embedded with nanoparticles is provided, including the steps of:
providing a precursor material comprising a polymer or ceramic precursor and magnetic nanoparticles, wherein the nanoparticles have a characteristic, such as magnetic, enabling to align or arrange the nanoparticles in the material by exposure, e.g. to a magnetic field;
preparing a formable mixture of the polymer or ceramic precursor with magnetic nanoparticles, wherein the mixture has a certain life time to allow the alignment of said nanoparticles in a way providing conductivity lines can be formed of these nanoparticles;
subjecting the mixture to electric, magnetic or electromagnetic field so as to (a) align the particles in a predetermined way whilst simultaneously subjecting the mixture to any standard process of pore formation in the mixture, so as to provide the two processes proceed at least partially in parallel; and
curing or solidifying the polymer or ceramic precursor in order to fix the shape of the porous material with nanoparticles embedded therein, whereby the conductivity lines are formed exhibiting the required electrical and/or electromagnetic conductivity.

As result, the form of the obtained material is fixed, wherein the nanoparticles form lines of desired electrical conductivity providing use of the obtained material as lens, antennas, absorbers, etc.

Depending upon the polymer selected and the size and distribution of voids or pores within the foam, the foams may range in mechanical properties from flexible to semi-flexible to rigid. Thus, foams according to the invention may be tailored for specific uses by judicious selection of polymer, and void or pore size, depending upon the intended use of the foam construct.

For example, in order to prepare the foams according to the invention, a method can be used as described in U.S. Pat. No. 5,677,355 using a fugitive. These fugitive compositions are solid crystalline compositions that have molecular weights of less than about 300 daltons and that are able to form a substantially isotropic solution when combined with the molten polymer that will form the substrate of the foam. Particulate magnetic filler can be admixed with the polymer in molten form before the addition of fugitive, together, or after the fugitive is mixed.

Upon cooling of the substantially isotropic polymer-magnetic filler-fugitive compound solution, the fugitive compound should separate from the polymer by crystallizing or forming inter-macromolecular entities. This can be realized through crystallization-induced microphase separation (CIMS). These crystals or entities may then be subsequently removed from the solidified polymer to produce voids or pores in the spaces they previously occupied. As magnetic particles remain embedded in the pores, they form magnetic structures having the size of the voids. The preferred fugitive compound are those solid, crystalline compositions that melt at temperatures above about 25° C.; and those crystalline solid compositions that sublime at temperatures above about 25° C. and that may also be extracted with solvents. Examples of suitable fugitive compounds include salicylic acid, naphthalene, phenanthrene, anthracene, and tetramethylene sulfone.

A magnetic or electromagnetic field may be applied to the precursor mixture before it is formed into a shaped article or whilst an article is being formed from the mixture, particularly whilst the shaped article is solidifying from the precursor mixture. The optimum manner of applying the field will depend on the composition being used. Thermotropic compositions, having an ability to retain their molecular organisation over a longer time scale than isotropic melts give a greater freedom of operation. It is generally necessary in the case of nonthermotropic polymer containing compositions to apply the field over that part of the process during which the solidification process starts to occur. The optimum part of the process over which the field should be applied can be readily determined experimentally.

The magnetic field can be provided by placing a source of electro magnetic radiation in close proximity to the precursor material, or, inserting the source of the magnetic field inside the porous magnetic structure formed thereby.

In one example embodiment, a mixture of the polymer precursor and nanoparticles is placed in alternative magnetic field of approximately 10 Oersted to 10 Tesla.

According to another embodiment, a mixture of the polymer precursor and nanoparticles is placed in constant magnetic field of approximately 10 Oersted to 2.5 Tesla.

For example, to provide antenna reflector, an antenna core in the form of electromagnetic device is placed in the precursor material whilst it is cured or otherwise solidified but is still formable. At this stage, the electromagnetic device can be used to create electromagnetic field of desired geometry so as to align nanoparticles to form continuous conduction lines of the desired length and width. After the shape of the material is fixed, the electromagnetic core device can be used as the antenna core.

One and the same core device can be used multiple times, for example, in case a new antenna reflector of different geometry is required, the porous polymer reflector built up on the core can be removed in any available way, e.g. by dissolving in a solvent, burning off, freezing to cause polymer degradation and so on, and the core can be re-used to manufacture a new antenna reflector of desired shape.

In still another aspect of the invention, a method of preparing porous structures embedded with nanoparticles is provided, including the steps of:

providing a porous precursor material comprising a polymer or ceramic porous material, providing magnetic nanoparticles dispersed in a carrier media, such as a suspension, solution, colloid, aerosol, hydrogel, such as ferrogel, or the like, wherein the nanoparticles have a first characteristic, such as magnetic;

contacting the porous precursor material with the above magnetic nanoparticles dispersed in a carrier media;

(a) subjecting the mixture to electric, magnetic or electromagnetic field so as to cause the particles to move into the pores of the porous precursor material, wherein the particles tend to concentrate along the magnetic field, so as to form continuous structures of predetermined conductivity sufficient for their potential use in practical applications;

(b) heating, drying, freeze-drying, or otherwise fixing the nanoparticles distributed within the porous system of the porous material, whereby conductivity lines are formed in the porous material which acquires thereby desired electrical and/or electromagnetic conductivity.

Optionally, the method according to the invention comprises additional step of subsequent coating of the obtained structures by a lightweight foam to prevent fragile structures from ruptures and increase the durability of the formed three-dimensional structures for further use in practice. The material of the invention may be obtained not only as specified above, i.e. by introduction of a magnetic particulate filler in the form of nanostructures in the process of preparation of porous polymeric matrix, e.g. during cross-linking of polymer and its foaming but also when nanoparticles of magnetic filler are formed directly in the final polymer matrix.

Thus, in another aspect of the invention, a method of fabricating porous structures embedded with nanoparticles is provided, including the steps of:

providing a precursor material comprising a polymer or ceramic precursor and a precursor of magnetic nanoparticles, wherein the nanoparticles have a characteristic, such as magnetic, enabling to align or arrange the nanoparticles in the precursor material by exposure, e.g. to a magnetic field;

preparing a formable mixture of the polymer or ceramic precursor with magnetic nanoparticles, wherein the mixture has a certain life time to allow the alignment of said nanoparticles in a way providing conductivity lines can be formed of these nanoparticles;

subjecting the mixture to electric, magnetic or electromagnetic field so as to align and redistribute the particles in a predetermined way;

subjecting the mixture to any standard procedure to convert the magnetic particle precursor into magnetic nanoparticles, and heating the polymer or ceramic precursor to form a porous structure with nanoparticles embedded therein, whereby the conductivity lines are formed exhibiting the required electrical and/or electromagnetic conductivity.

Any other processes for producing dimensionally-stable composite materials comprising magnetic particles embedded in a porous matrix of organic polymeric materials can be used as intermediate steps in a method of the present invention, such as in U.S. Pat. No. 4,211,664, RU 2226012, RU 2239250, RU 2241537, the disclosures which are incorporated herein by reference in its entirety.

DETAILED DESCRIPTION OF THE INVENTION

The invention will be now described in more detail with reference to non-limiting example embodiments and figures which serves for illustration purposes only and in no way shall be interpreted as limiting the invention, which is defined in the attached claims.

Uses of a Porous Magnetic Material

Porous materials embedded with nanoparticles produced as described above according to the invention can be used in various applications including RF applications, low frequency applications, etc.

A. Radiofrequency (RF) Lens

In one example embodiment, a radio frequency lens made of the porous matrix material embedded with nanoparticles is provided. The RF lightweight lens device comprises a porous matrix made of three dimensional syntactic polymer foam with embedded nanoparticles distributed within the porous matrix in a way providing continuous conductivity lines are formed having the predetermined length and width.

The nanoparticles may be magnetic powders with particle size from 1 nm to 10 microns consisting of Fe, Co, Ni, Cr, rare-earth and other metals, various ferrites, such as ferrites of type $MFe_2O_4$ (where M=Mn, Ni, Cu), Ni—Zn ferrite, barium hexaferrite, other ferrites, iron-nickel alloys, iron-cobalt alloys, alloys based on rare-earth metals Nd—Fe—B, Sm—Co; Fe—B—Co—R (where R is a rare-earth element), or a combination thereof. The porous matrix may comprise foam polymer materials or ceramic materials. The foam material may be syntactic or blown foam, and may be thermoplastic or thermoset. The particles embedded in a porous matrix form a pattern upon subjection to electromagnetic field of a certain geometry and power, so as to provide specific wave propagation or absorption properties.

B. Bulk Wave Absorber

According to one embodiment of the invention, a bulk absorber is provided with a body comprising a porous polymer matrix and particles dispersed throughout the matrix in a predetermined pattern and substantially continuous concentration gradient. The particles are magnetic powders with particle size from 1 nm to 100 nm in the form of spheres, bullets, other nanostructures, such as nanowire, consisting of Fe, Co, Ni, Cr, rare-earth and other metals, various ferrites, such as ferrites of type $MFe_2O_4$ (where M=Mn, Ni, Cu), Ni—Zn and combination thereof with carbon, graphite, carbon fibers, coated hollow microspheres, carbon black, carbon whiskers, or a combination thereof. The absorber is formed by placing an object, such as a source of radiation or magnetic field in mould, leaving a space between the object and walls of the mould and pouring or ejecting into this space a precursor material, such as polymer precursor in admixture with particulate nanostructures. The next step is subjecting the mould to electromagnetic or magnetic radiation of a predetermined geometry so as to align the nanoparticles in a predetermined pattern within the polymer body. Upon solidifying, the polymer matrix will have a macrostructure of a certain geometry formed of nanoparticles embedded therein. The foam material may be cross-linked polyolefins (polyethylene, polypropylene) with various degree of cross-linking up to 80%.

More particularly, there is provided a bulk absorber for absorbing RF radiation, which comprises a three-dimensional body comprised of a cross linked foamy polyolefins (polyethylene, polypropylene) with degree of crosslinking up to 80% based on high molecular weight and ultra high molecular weight polyolefins, and a plurality of magnetic or dielectric property-altering particles dispersed in a substantially continuous concentration of the three-dimensional body. The gradient extends along at least one dimension of the three-dimensional body (in one preferred embodiment, the body is a rectangular solid and the particle gradient extends along its depth, but can also extend along either or both of its height and its width), so that along the at least one dimension, the concentration of particles changes at a substantially continuous rate. The substantially continuous concentration gradient of property-altering particles results in a proportionally continuous rate of change of the altered property along the at least one dimension of the body.

Example of Preparation of the Wave Absorber

The wave absorber was obtained by molding of polyethylene (PE) using Carbon dioxide ($CO^2$) as physical foaming agent, which is a low cost and non-flammable gas with good blowing power and fast dissolution in polymers. In the pre-mixed 25 g of precursor mixture of the polyethylene polymer 20 g of nickel particles having 10 nm to 25 nm size were admixed for 10 min mixing time. The opposite walls of the mould were made of magnet material to form a magnetic field of 2 T. After cooling, the articles were extracted from the forms, cut into pieces of equal length and weighted to measure the density of the articles. The density was 2.5 g/cm2 in the vicinity of the magnetic walls as compared to the density of the articles, 2.0 g/m2 obtained in a regular moulds that were not subjected to magnetic filed. Further, the electrical conductivity of the articles produced in the magnetic forms was 100 OM.mm (50 Hz) compared to 1.5 Om.mm in the absence of magnetic field. A particularly important advantage of the present invention is that the inventive process for making the three-dimensional body enables its fabrication (a) as a unified whole, (b) from a single mixture of initial substances, including a precursor material and particles, meaning that, unlike the prior art, it need not be formed as a laminate comprising a plurality of layers laminated together with bonding layers, wherein each layer has to be manufactured from a separate precursor mixture with different composition, so that the process of laminating them together results in a stepwise change in particle concentration. According to the inventive process, a concentration gradient is provided by exposure of a semi-solidified viscous precursor mixture to a magnetic or electromagnetic field of predetermined geometry to form the desired gradient of particles distribution and thus, the desired gradient of electromagnetic and other properties.

In other words, the present invention resolves prior art problems concerning a predictable process for fabricating a bulk absorber having a continuous concentration gradient of property-altering particles along one or more dimensions of the bulk absorber body, so that it is no longer necessary to create a plurality of layers, or mix separate flows of polymers precursors, each having a different concentration of particles, and then combining them together to create a stepwise or continuous particle concentration gradient. The inventive process and product is much easier to implement and much less labor-intensive to make than the prior art approach.

C. Manufacturing System for Fabricating Porous Magnetic Material

In another aspect of the invention a manufacturing system for fabricating the bulk absorber comprises mixing devices, control means, a source of electromagnetic radiation, positioning means, and forming means.

The mixing means produce a precursor mixture of a polymer precursor and magnetic nanoparticles, which are fed by delivery devices such as vibrational feeders. The control means varies the ratio of the flow of particles and precursor polymer. The control means may be any suitable device or control system for controlling the flow rates of precursors.

The positioning means deposits the pre-mix in a predetermined form to build a non-solidified item, and adjust the relative position of the mould with non-solidified item a source of magnetic radiation. The positioning means may comprise a translation means and/or a rotation means for changing the location of the mould in a horizontal direction relative to the source of magnetic radiation.

The forming means is for solidifying the non-solidified item into the bulk absorber. In an aspect of the invention, when the polymer is thermosetting material, the solidifying means sinters the non-solidified item in a sintering oven. Alternatively, when the polymer is cross-linking material, the forming means can be a source of cross-linking agent, or a source of cross-linking radiation. When the polymer is a foaming, the forming means comprise a foaming chemical or physical agent, and so on.

In an aspect of the invention, the first flow of polymer precursor and second flow of magnetic particles may be produced from vibrational feeders. The first and second flows are then intermixed in a mixer and discharged from a discharge point in a combined flow. The combined flow falls vertically into the cavity, with the cavity being positioned under the discharge point to adjust the cavity position relative to the source of magnetic irradiation. After the pre-mix is positioned in the cavity, it is subjected to electromagnetic radiation of desired strength and impulse duration, so as to achieve the particles re-distribution with the pre-formed mixture. After the desired re-distribution has occurred, the mixture is subjected to processes of curing, sintering, thermosetting, or otherwise fixing the shape of the pre-formed article whilst continuing to subject the article to electromagnetic radiation.

In an aspect of the invention, in addition to magnetic nanoparticles described above, other magnetic or dielectric materials may be admixed to modify the properties of the resulted material, such as carbon fibers, coated hollow microspheres, carbon black, carbon whiskers, or a combination thereof. Further, absorber precursors may comprise foam or ceramic material. The foam material may be syntactic or blown or may be thermoplastic or thermosetting.

D. Antenna Reflector

In one embodiment of the invention, a pre-selectable geometry antenna reflector adapted to provide a desirable transmit and/or receive coverage zone, for example a zone surrounding an object in question, that can be easily manufactured in place where it is supposed to be used. The antenna geometry thus can be modified depending on the actual needs and application conditions, such as visibility, weather conditions, required distance and frequency coverage. In practice this means a pre-configurable shaped contour beam antenna reflector or, for short, a pre-configurable antenna reflector.

It is to be understood that the invention is applicable to any antenna reflector where it is necessary to be able to produce antenna reflector corresponding to a predetermined shape of the beam in service without the necessity of changing the core of the antenna.

The conventional way to obtain a shaped contour beam is to use multiple feeds illuminating a single or double offset reflector system according to an appropriate law. The beam is obtained by exciting the feed elements with optimized phase and amplitude by means of a signal forming network composed of waveguides ("beam forming network").

These waveguides can be formed by nanoparticles dispersed in the bulk material and aligned by subjecting the material at production step to magnetic field of the predefined geometry, so that the nanoparticles form lines of sufficient conductivity and aligned in space to form an antenna reflector of the required shape.

It is particularly advantageous in those applications, where it is necessary to be able to modify the beam shape in use, such as in orbit, in order to compensate for variations in orbital position and to meet new service constraints. Reconfigurable antenna systems are conventionally obtained by integrating into the beam forming network power splitters and phase-shifters with variable characteristics. This renders the multiple feed highly complex which introduces radio frequency power losses, the risk of passive intermodulation products in the case of a transmit antenna, constraining thermal regulation requirements for the satellite platform and a mass penalty.

An alternative solution to the problem of reconfiguring a reflector antenna in orbit is to employ a method according to the invention to enable manufacturing the antenna in place, e.g., in orbit, with one or more reflectors of predetermined reflective surfaces so that the radiation diagram obtained thereby can be shaped as desired.

In an embodiment of the invention, a lightweight bulk pre-configurable antenna reflector is provided having a rigid core structure, a reflective structure formed of aligned nanoparticles embedded within the porous matrix and exhibiting radio reflection properties.

According to possibly combinable preferred features of the invention the reflective structure is formed by magnetically aligned interconnected nanoparticles embedded within polymer or ceramic matrix to form electrically conductive three-dimensional reflectors.

The reflective properties can be further enhanced by combining the methods of embedding nanoparticles in a polymer or ceramic material. Thus, nanoparticulate material in the form of nanowire can be introduced in a precursor material and subsequently, another nanoparticulate magnetic material, e.g. in the form of spheres can be introduced in the pore system after curing, to improve or modify the conductivity thereby. The metal particles can be deposited in vacuum, or adhesively bonded.

Negative Refraction Index Materials

The proposed porous magnetic material according to the invention could also find application in sub-wavelength lensing in flat panels of left-hand materials (LHM). The materials could be manufactured based on the method described above using a "left hand" nanoparticulate filler dispersed in a predetermined manner in a porous polymer matrix. As a result, a rectangular material with planar surfaces can be manufactured that can be used to focus light into a tight spot. The size of this spot, furthermore, is less than half the wavelength of the light being used.

Getting around the venerable "diffraction limit" (whereby an object smaller than the wavelength is difficult to image) would be a boon to optics (in the microwave range, for example, wireless communications would benefit at the level of cell phones and base stations) and is normally achieved only by parking the object very close to the source of the illumination.

Left-handed materials (so called because the "right-hand rule" used by physicists to picture the relation between a light pulse's electric and magnetic fields and its line of propagation is here reversed) possess a negative index of refraction. This fact, in turn, means that a light ray approaching from air into the LHM material will be deflected not toward but back and away from a line drawn perpendicular to the surface of the material. It is this bizarre deflection that leads to novel optical effects. (see, Toronto group, Grbic and Eleftheriades, Physical Review Letters, upcoming article; Moscow group, Lagarkov and Kissel, Physical Review Letters, 20 Feb. 2004)

Thus, the method of the invention can be used to fabricate a composite material with simultaneously negative permeability and permittivity, such as described by D. R. Smith*, Willie J. Padilla, D. C. Vier, S. C. Nemat-Nasser, and S. Schultz; Department of Physics, University of California, San Diego, 9500 Gilman Drive, La Jolla, Calif. 92093-0319, 2 Dec. 1999. A medium possessing a negative mu and epsilon, can be used to explore the novel optical effects predicted by the Russian scientist Veselago. Furthermore, the novel material can be adapted to accommodate shorter wavelengths. As for applications in microwave communications, a medium which focuses waves when other materials would disperse them (and vice versa) ought to be useful in improving existing delay lines, antennas, and filters.

BRIEF DESCRIPTION OF THE DRAWINGS

These and other objects and features of embodiments of the present invention will become apparent from the following detailed description considered in connection with the accompanying drawings which are attached hereto and form a part hereof. It should be understood, however, that the drawings are designed for the purpose of illustration only and not as a definition of the limits of the invention.

The following drawings are included.

EXAMPLES OF PREPARATION

Example 1

As a polymer precursor, 9 g of epoxy resin ED-20 (epoxydiane resins formed by reaction of bisphenols A or F with epichlorohydrine) available from Chimex Ltd, St. Petersburg, Russia) and 1-2% mas of curing agent triethylenetetramine (TETA) (foaming at ambient temperature 20° C.) were mixed in a form with 2-5 mass parts of microspheres having bulk density of 200 kg/m3. After 7-8 minutes of through mixing, 1 to 3 g of commercially available nanoparticles of Fe R-10, (30 nm to 150 nm, initial µ2,000-3,000, specific permeability 0.1 мкОм/м) obtained by reaction $Fe(CO)_5 = Fe + 5CO$, available from OAO Sintez, Nizhni Novgorod, were added and the mixing was continued for another 7 min. Then, the mixture was subjected to magnetic field having intensity around 300 mT at a distance of 0.5 mm from the surface, generated by a permanent magnet NbFeB (Hcj 880-1595 Ka/m), available from PolyMagnet Ltd, Moscow, and left for 20-180 min. See a magnetic field map used to prepare the articles in Table 1.

TABLE 1

| Magnet No.: | Induction at the distance of 0.5 mm from a surface in a point, mTesla | | | | | | | | | |
|---|---|---|---|---|---|---|---|---|---|---|
| | Point 1 | Point 2 | Point 3 | Point 4 | Point 5 | Point 6 | Point 7 | Point 8 | Point 9 | Point 10 |
| 1 | 395 | 395 | 333 | 387 | 389 | 387 | 388 | 321 | 380 | 392 |
| 2 | 411 | 404 | 341 | 398 | 396 | 390 | 397 | 323 | 390 | 396 |
| 3 | 400 | 396 | 339 | 377 | 397 | 400 | 401 | 329 | 391 | 394 |
| 4 | 230 | 233 | 240 | 229 | 245 | 245 | 241 | 245 | — | — |

TABLE 1-continued

| | Induction at the distance of 0.5 mm from a surface in a point, mTesla | | | | | | | | | |
|---|---|---|---|---|---|---|---|---|---|---|
| Magnet No.: | Point 1 | Point 2 | Point 3 | Point 4 | Point 5 | Point 6 | Point 7 | Point 8 | Point 9 | Point 10 |
| 5 | 243 | 241 | 241 | 242 | 236 | 236 | 233 | 233 | — | — |
| 6 | 249 | 245 | 250 | 246 | 228 | 226 | 230 | 228 | — | — |

Intensive foaming was observed resulting in the increase of viscosity 3:1 and increase of volume 2:1 from the initially measured. In the absence of magnetic particulate filler, no change of viscosity was observed in the same time frame. Low concentrations of particles (5 to 10% mass) were also used however this required the higher strength of magnetic field applied to form the structures according to the invention.

Figure 2:
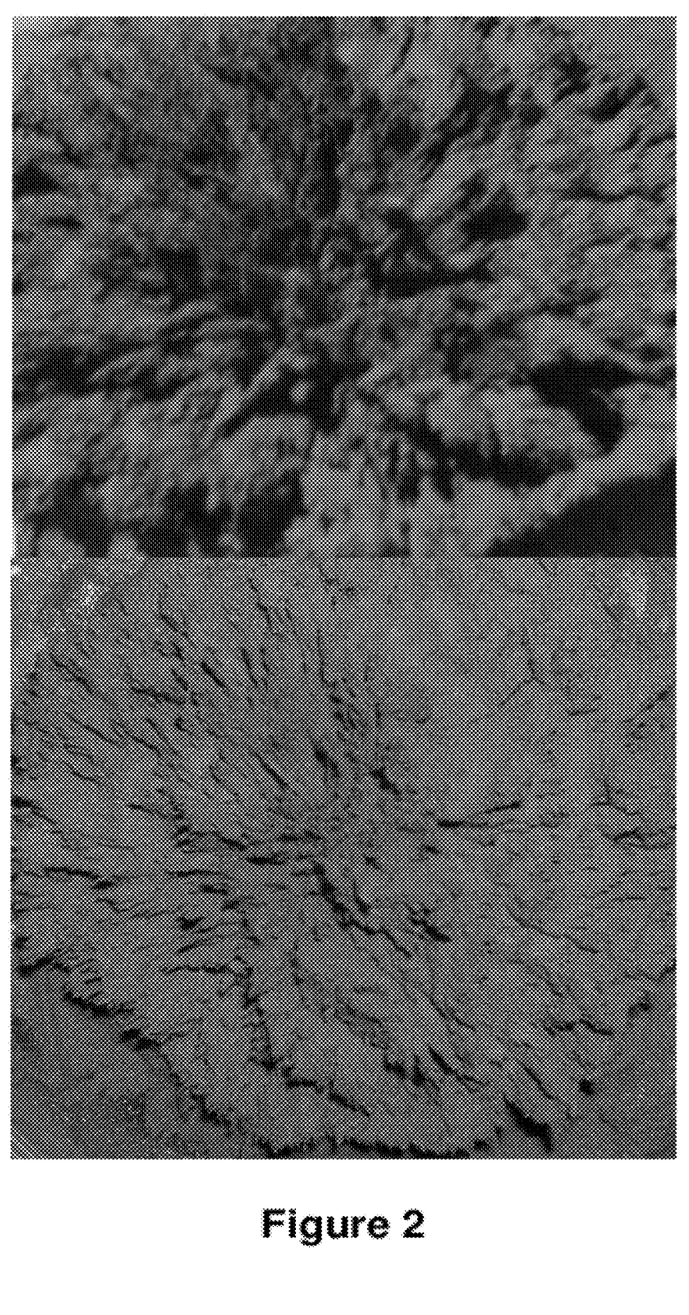
FIG. 2 is a photograph showing needle-shaped protrusions formed on the surface of a porous article (see Ex. 1, table 1) made of a precursor mixture comprising nanoparticulate magnetic material dispersed in a polymer matrix according to the invention.

As can be seen in the photo, on the surface of the obtained article needle-like protrusions were formed in the direction of magnetic field which was produced by the permanent magnet positioned centrally. After predetermined time, the foaming was completed, the magnetic field was removed, and the obtained article was left for 24 hours for complete curing of the resin. The magnetic permeability measured in the articles showed significant increase for Examples 3, 4 and 5. Some articles were subsequently coated with lightweight foam to increase the durability of the formed three-dimensional structures for further use in practice. The articles having needle-like protrusions formed in the direction of magnetic field lines are shown in FIG. 2.

mixed in a form with a foaming system consisting of 1.0-2.0 mass parts of liquid glass and 0.25-1.50 mass parts of Al particles (10-50 mcm). After 3-5 minutes of through mixing, 10 to 30 g of commercially available nanoparticles of Fe R-10, (30 nm to 150 nm, initial μ 2,000-3,000) obtained by reaction $Fe(CO)_5 = Fe + 5CO$, available from OAO Sintez, Nizhni Novgorod, were added and the mixing was continued for another 7 min.

Then, the mixture was subjected to magnetic field having intensity around 300 mT at a distance of 0.5 mm from the surface, generated by a permanent magnet NbFeB (Hcj 880-1595 Ka/m), available from PolyMagnet Ltd, Moscow, and left for 20-180 min. See a magnetic field map used to prepare the articles in Table 1.

Intensive foaming was observed resulting in the increase of viscosity 4:1 and increase of volume 2:1 from the initially measured. As can be seen in the photo, on the surface of the obtained article needle-like protrusions were formed in the direction of magnetic field which was produced by the per-

| Ingredients, mass parts | Compositions 1-7 | | | | | | |
|---|---|---|---|---|---|---|---|
| | 1 | 2 | 3 | 4 | 5 | 6 | 7 |
| ED-20 | 9 | 9 | 9 | 9 | 9 | 9 | 9 |
| Microspheres | 5 | 2.5 | 3 | 1 | 2 | 2 | 2 |
| Fe (30-150 nm) | 30 | 20 | — | 30 | 20 | 15 | 10 |
| Ni (100 mcm) | — | — | 30 | — | — | — | — |
| Curing agent | 1 | 1 | 2 | 2 | 2 | 2 | 2.5 |
| Additional foam made of organic foaming agent, vol. parts | — | — | 50 | — | — | — | — |
| Foaming | Low foaming | Low foaming | Optimal foam | Optimal foam | Fair foaming | Fair foaming | Fair foaming |
| Needle-like protrusions | no | no | yes | yes | yes | yes | yes |
| Orientation of particles | Low capability to orientate, the viscosity is too high | Low capability to orientate, the viscosity is too high | Excellent orientation capability, optimal viscosity | Excellent orientation capability, optimal viscosity | Excellent orientation capability, near to optimal viscosity | Good orientation capability, near to optimal viscosity | Good orientation capability, near to optimal viscosity |
| Magnetic permability μ | 850 | 1100 | 2500 | 2300 | 1800 | 1500 | 1300 |

Example 2

As a polymer precursor, 10 g of epoxy resin ED-20 (epoxydiane resins formed by reaction of bisphenols A or F with epichlorohydrine) available from Chimex Ltd, St. Petersburg, Russia) and 1.5-2.5% mas of curing agent triethylenetetramine (TETA) (foaming at ambient temperature 20 C) were manent magnet positioned centrally. After predetermined time, the foaming was completed, the magnetic field was removed, and the obtained article was left for 24 hours for complete curing of the resin. The magnetic permeability measured in the articles showed significant increase for Examples I, III and IV. The articles having needle-like protrusions formed in the direction of magnetic field are shown in FIG. 2

| Ingredients, mass parts | Compositions I-IV | | | | | |
| --- | --- | --- | --- | --- | --- | --- |
| | I | II | IIa | III | IV | V |
| ED-20 | 10 | 10 | 10 | 10 | 10 | 10 |
| Liquid glass 20% | 1.0 | 1.0 | 1.0 | 1.0 | 2.0 | 2.0 |
| Fe (30-150 nm) | 30 | 20 | 10 | — | 30 | 15 |
| Ni (100 mcm) | — | — | — | 30 | — | — |
| Curing agent | 1.5 | 1.5 | 1.5 | 2 | 2 | 2 |
| Al (10-50 mcm) | 0.25 | 0.25 | 0.25 | 0.25 | 1.5 | 1.5 |
| Foaming | Optimal foaming | Low foaming | Low foaming | Optimal foam | Optimal foam | Optimal foam |
| Protrusions | yes | no | no | yes | yes | yes |
| Orientation of particles | Excellent capability to orientate, optimal viscosity | Low capability to orientate, low particle concentration | Low capability to orientate, low particle concentration | Excellent orientation capability, optimal viscosity | Excellent orientation capability, optimal viscosity | Excellent orientation capability, optimal viscosity |
| Magnetic permability μ | 2400 | 860 | 850 | 2500 | 2350 | 2150 |

Some articles were subsequently coated with lightweight foam to increase the durability of the formed three-dimensional structures for further use in practice.

Example 3

Preparation of a Polymer Composition Based on Polyurethane Granules, Nanoparticulate Filler and Solid Salicylic Acid as Blowing Agent The composition is a foaming system of a well-known type comprising thermoset polymers of the type used with surfactants, blowing agents and a catalyst system. A typical core formulation may be as follows:

Nylon 12 Microporous foam embedded with manganese ferrite $MnFe_2O_4$ nanoparticles having size 1 nm to 30 nm.

Solid Nylon 12 pellets were heated with solid salicylic acid to form a 30% (by weight) isotropic solution while using mechanical stirring. About 10% of manganese ferrite nanoparticles were added under continuous stirring. A magnetic field of 2 T was applied in the direction transversely the axis of the mechanical mixer for a period of 30 minutes. After thorough mixing the solution was heated to about 190° C. in an inert atmosphere and the vessel was then quenched in liquid nitrogen. The solid foam obtained was washed with chloroform to remove the salicylic acid.

Characterization of the Nylon 12 foam was accomplished using scanning electron microscopy (SEM) and revealed a pore size of 50 to 100 microns. Continuous porosity was verified using the dye-transport method.

The distribution of manganese ferrite particles was studied using X-ray diffraction and electron beam microscopy.

Figure 1:
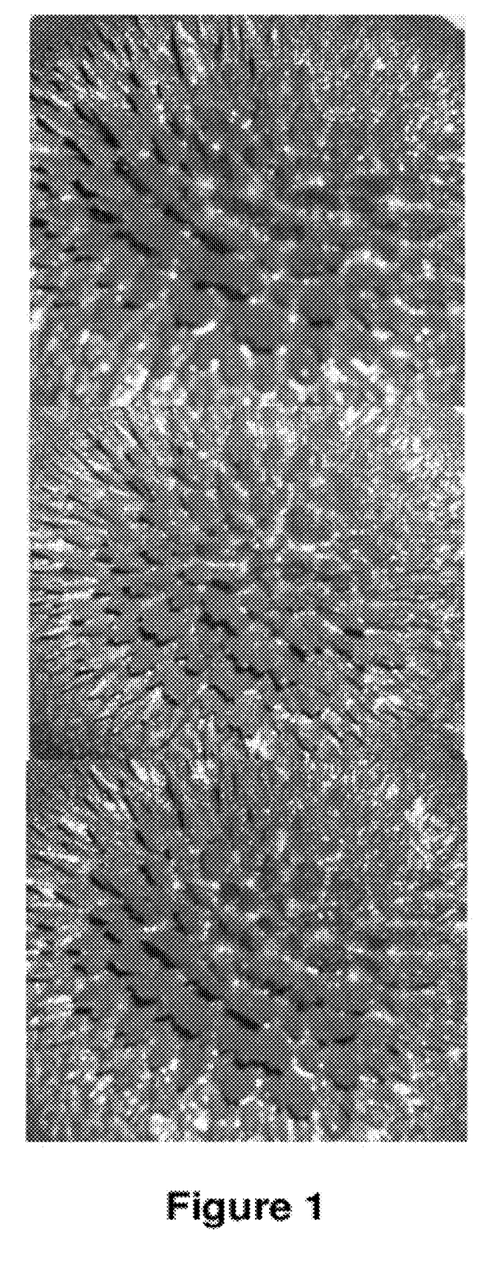
FIG. 1 is a photograph showing needle-shaped protrusions formed on the surface of a porous article (see Ex. 3) obtained of a precursor mixture comprising nanoparticulate magnetic material dispersed in a polymer matrix.

The studies have shown that ferrite particles have formed conductive lines of the geometry shown in FIG. 1.

Example 4

Preparation of a Foaming System of a Known Type Comprising Polyol and Isocyanate, Water as Blowing Agent, a Catalyst System and Iron Nickel Alloy as Nanoparticulate Filler 4.1. A polyurethane foam was produced by reaction of 30 to 70 weight % of a long chain polyol having OH value of 20 to 160 and 0 to 18 weight % of a short chain polyol having OH value of 450 to 1850 with 30 to 50 weight % of an aromatic polyisocyanate, such as diphenyl methane di-isocyanate and using a water as a blowing agent.

4.2. A polyurethane foam was produced by the reaction of 70 to 90 weight parts of a polyol having molecular weight of 4000 to 8000, 10 to 30 weight parts of an amine and/or polyol having isocyanate equivalent value of 50 to 150 and a di-isocyanate prepolymer being equivalent to isocyanate index of 90 to 115, adding 0 to 2 weight parts of a catalyst and 3 to 5 weight parts of water.

The above components including polyol plus isocyanate system, iron nickel alloy filler, catalyst system and water were supplied from supply tanks to a mixing head located upstream a premix reservoir. Upon mixing, the pre-mix was fed into a cavity of predefined form and subjected to a impulse magnetic field of 10 oersted to 2 T using a magnetic coil of the diameter 80 mm and length 50 mm equal to the length of the cavity. The relative position of the magnetic coil and the pre-form was selected based on the required strength of the magnetic field.

The sample obtained in Example 4.1 showed open porosity and desirable RF wave absorption efficiency. The sample obtained as described in Example 4.2 showed a desirable RF absorption efficiency and less open porosity.

Example 5

Compositions containing various concentrations of Ni—Zn ferrite were prepared by compounding a dry blend of the filler with aromatic polyester formed in accordance with the teaching of U.S. Pat. No. 4,161,470 and consisting of 73 mole percent of p-oxybenzoyl units and 27 mole percent 6-oxy-2-naphthoyl units. The polyester had an intrinsic viscosity of 6.4 dl/g measured on a 0.1% by weight solution in pentafluorophenol at 60 C. The blend was compounded on a two roll mill at a roll temperature of 300 C.

A magnetic field of 0.5 Tesla was applied across the mould, perpendicular to the direction of flow of the composition into the mould. Control samples were prepared from the listed compositions but with no magnetic field applied. The results obtained are listed below.

Example 6

A composition containing 25% by wt of barium ferrite (Embedding Powder 304) obtained from Ferro Corporation having an average particle size of 1.8 microns was prepared by compounding a dry blend of the filler with the wholly aromatic polyester used in Example 1. The compounding was performed using a Gays (Hampton) Ltd TS40 twin-screw compounding extruder. The ferrite containing composition was formed into sheets having thickness 3 cm.

A magnetic field was applied perpendicular to the plane of the sheet over a length of 71 cm. The field was positioned so that there was a gap of 16 cm between the die and the start of the field so that solidification of the composition commenced whilst within the field. The field was obtained using a stack of seven pairs of electromagnets positioned to have a 7 mm gap between the pole pieces, the sheet being drawn through the tap. The field was measured using an LDJ Electronics gaussmeter (Model 511) as 0.01 to 0.05 Tesla. Control samples were prepared with no applied magnetic field and with no magnetic filler present. The results obtained are given in Table II.

Example 7

A porous polyurethane substrate is impregnated by organic precursor of a ceramic composition which can be converted to a porous ceramic material on heating. The porous ceramic material is porous to gases and/or liquids. Examples of suitable organic compounds include aluminium or zirconium substituted or unsubstituted $C_1$-$C_8$ alkyl carboxylates, such as propionate or ethylhexanoate. The organic precursor is dissolved in an appropriate organic solvent. This is determined by the nature of the organic precursor and may for example be ethanol, methanol, dimethylsulfoxide, tetrahydrofuran, chloroform, hexane, dichloromethane, ethylacetate, acetone, diethylether and the like. An organic precursor comprising compounds of zirconium and yttrium may for example be dissolved in tetrahydrofuran. Preferably, the ceramic precursor is an organic compound of zirconium, such as zirconium substituted or unsubstituted $C_1$-$C_8$ alkyl carboxylate, such as zirconium propionate. Then, a ceramic precursor composition is mixed with magnetic nanoparticles in the ration of 20% magnetic nanoparticles to 70% ceramic precursor to obtain a suspension and a polyurethane substrate is dipped into the suspension. The magnetic field is applied to the suspension for 10 min, the obtained article is dried in the air and after drying for 2 hours, subjected to heating. The heating is carried out at a temperature in the range from about 350° C. to about 1000° C., typically 400° C., for a period between about 10 seconds to about 10 minutes. Thus, the obtained porous ceramic-metal composite comprises: a substrate; a porous ceramic formed by the metal oxide and metal particles incorporated in the ceramic.

Subjection to Magnetic Field

It has been found that the properties of shaped articles formed from the compositions of the invention can be controlled by the application of a magnetic field to a pre-mix of composition, or to a precursor of the composition whilst it is being fabricated into an article. Thus, if a magnetic field is applied perpendicular to the direction of flow of a thermotropic polymer containing composition, an orientation of the nanoparticles in the flow direction is obtained, as indicated by an increase in magnetic constant and electric conductivity in this direction for a resulting shaped article. This effect can be achieved at substantial levels of filler for large particles and relatively low levels of filler for a smaller particles (a significant effect is observed at a concentration of 2% by weight of barium ferrite, though high concentrations up to 10-15% are desirable). The effect is different from the effect which is generally observed when magnetically inert fillers are present.

Although the prime purpose of the presence of the magnetically susceptible filler in the composition is to produce waveguides of desired geometry, another application is providing a wave absorber having anisotropic structure. Similarly to shock absorber, the proposed material can be used as wave absorber. Magnetic properties of the filler may also be utilised in other applications. For example, thermotropic polymer containing compositions may be used to mould a lightweight magnet. In such applications high concentrations of magnetically susceptible filler are required.

Radio Wave Absorber

An article is formed as described above of microcellular polyester foam having a continuous, open-cell structure with pores of the size from 10 nm to 100 nm wherein ferrite nanoparticulate material is embedded in the walls of this pores.

The invention process permits a degree of control over the range of pore sizes so that the foams may be custom-tailored for specific applications.

Conventional foams, produced by traditional methods of foam formation, have voids or pores ranging from 50 to 100 microns in diameter. By some definitions, microcellular foams are those containing cells less than 50 microns in diameter. However, in the specification and claims, materials referred to as microcellular foams are those foams containing voids or pores of varying geometries, that are suitable for various biomedical applications. Such foams preferably contain pores or voids with dimensions of from about 1 to about 400 microns, most preferably from about 5 to about 200 microns.

Foams, according to the invention, may be made from suitable organic polymeric materials, including thermoplastic polymers, such as polyamides, polyesters, and polyolefins. Other suitable polymers include poly(dioxanone), polyglycolic acid, polylactic acid, polyalkylene oxalates and copolymers thereof.

Concentration of Electromagnetic Radiation

A composition containing Ni—Zn ferrite was prepared as in Example 3 in accordance with U.S. Pat. No. 4,161,470. An electro magnetic coil was placed in the cavity and the cavity was filled with the foam precursor and whilst the coil is energized, the foam precursor was solidified under the required temperature conditions. In this way, the cold served as a source of electromagnetic field to obtain a desired nanostructure of magnetic particles dispersed through the resulted porous article.

The resulted article was tested in the wave range of 10 to 100 kHz (which corresponds to wave lengths $\lambda \approx 3$-$30$ km). With no desire to be bound by a particular theory, the inventors believe that nanoparticles form conductive lines arranged along the lies of electromagnetic field generated by the electromagnetic coil. Similar to the lines of magnetic field that concentrate to the center of the coil, the nanoparticles form the lines that can serve to concentrate the waves. In this case, the wave will follow the lines and create a magnetic circuit.

We claim:

1. A porous magnetic material capable of absorbing, disseminating, reflecting or concentrating electromagnetic radiation with frequencies in the range from 10 kHz to 100 GHz comprising:
   a) a polymer substrate made of foamed polymers having porous structure, and
   b) particles embedded in the substrate, the particles having a diameter of about 1 nanometer to 100 micron and made of a magnetic or dielectric material selected from the group consisting of Fe, Co, Ni, Cr, rare-earth metals, various ferrites, such as ferrites of type $MFe_2O_4$ (where M=Mn, Ni, Cu), Ni—Zn ferrite, barium hexaferrite, iron-nickel alloys, iron-cobalt alloys, alloys based on rare-earth metals Nd—Fe—B, Sm—Co, Fe—B—Co—R (where R is a rare-earth element), or a combination thereof, wherein the said particles are aligned within the polymer substrate in continuous conductive lines to form a three-dimensional waveguide structure or a plurality of structures having at least one characteristic dimension selected from the width and length of the said conductive line, which is proportional to at least one wave length or wave length range of the said absorbed, disseminated, reflected or concentrated electromagnetic radiation.

2. The porous magnetic material of claim 1, wherein the particles are embedded in the substrate and/or in pore walls, or deposited onto pores of the substrate.

3. The porous magnetic material of claim 1 wherein the particles or structures formed thereof are dispersed throughout the substrate in a substantially continuous concentration gradient which extends along the said at least one characteristic dimension.

4. The porous magnetic material of claim 1 wherein the particles are aligned to form a pattern or structure of continuous conductive lines as defined by the geometry of electric, magnetic or electromagnetic field it is subjected in the process of manufacture.

5. The porous magnetic material of claim 1 wherein the particle size is from 3 nm to 27 nm.

6. The porous magnetic material of claim 1 wherein said magnetic particles are selected from the group consisting of iron, cobalt, nickel, chromium, dysprosium, gadolinium, or a combination thereof, or a transition metal, such as selected from the group consisting of Ti, Sc, V, Cr, Mn, Cu, Zn, Y, Zr, Nb, Mo, Ru, Pd, Ag, Cd, Hf, Ta, W, Re, Os, Ir, Pr, U, and Hg.

7. The porous magnetic material of claim 1 wherein said dielectric particles are selected from Al, Sn, Ga, Ge, In, Pb, Sb, As, Ga, Bi, Mg, Ba, Ca, Sr, and Be.

8. The porous magnetic material of claim 1 wherein the particles are selected from nano-fibers, nano-spheres, nano-ovals, nanowire, etc.

9. The porous magnetic material of claim 1 wherein the foamed polymer is selected from syntactic or blown foam made of a polymer selected from polyolefins, polydienes, polyesters, polyamides, vinyl polymers, ionomers, acrylic acid polymers, polyacrytates, polysulphonates, polyphenylenoxides, polyacetals, silicone polymers, thermoplastic polyuretans, thermoplastic polyimids, polyketons, phenolic acid apolymers, melamine resins, epoxy resins, saturated polyesters, thermosetting polyurethanes, co-polymers and halogen-containing derivatives thereof, foramed polyurethanes, foamed polystyrenes, polyvinylchlorides and combinations thereof.

10. A porous magnetic material capable of absorbing, disseminating, reflecting or concentrating electromagnetic radiation within frequencies in the range from 10 kHz to 100 GHz, comprising:
 (a) a porous substrate made of ceramic material having porous structure; and
 (b) particles embedded in the substrate, the particles having a diameter of about 1 nanometer to 100 micron and made of a magnetic or dielectric material selected from the group consisting of Fe, Co, Ni, Cr, rare-earth metals, various ferrites, such as ferrites of type $MFe_2O_4$ (where M=Mn, Ni, Cu), Ni—Zn ferrite, barium hexaferrite, iron-nickel alloys, iron-cobalt alloys, alloys based on rare-earth metals Nd—Fe—B, Sm—Co, Fe—B—Co—R (where R is a rare-earth element), or a combination thereof;

wherein the said particles are aligned within the porous ceramic substrate in continuous conductive lines, which form a three-dimensional waveguide structure or a plurality of structures having at least one characteristic dimension selected from the width and length of the said conductive line, which is proportional to at least one wave length or wave length range of the said absorbed, disseminated, reflected or concentrated electromagnetic radiation.

11. A bulk absorber for absorbing RF radiation, which comprises magnetic or dielectric nanoparticles having a diameter of about 1 nanometer to 100 micron of a material selected from Fe, Co, Ni, Cr, rare-earth metals, various ferrites, such as ferrites of type $MFe_2O_4$ (where M=Mn, Ni, Cu), Ni—Zn ferrite, barium hexaferrite, iron-nickel alloys, iron-cobalt alloys, alloys based on rare-earth metals Nd—Fe—B, Sm—Co, Fe—B—Co—R (where R is a rare-earth element), or a combination thereof, wherein the nanoparticles are dispersed within a three-dimensional porous substrate made of foamed polymer; the particles being embedded in the said porous body and/or in the walls of the said pores in amount of 0.2 to 15% by mass and aligned in continuous conductive lines, which form within the substrate a three-dimensional pattern or structure or a plurality of structures having at least one characteristic dimension selected from the width and length of the said conductive line, which is proportional to at least one wave length or lengths of the said RF electromagnetic radiation.

12. A bulk absorber for absorbing RF radiation of claim 11, wherein the said foamed polymer is selected from syntactic or blown foam made of a polymer selected from polyolefins, polydienes, polyesters, polyamides, vinyl polymers, ionomers, acrylic acid polymers, polyacrylates, polysulphonates, polyphenylenoxides, polyacetals, silicone polymers, thermoplastic polyuretans, thermoplastic polyimids, polyketons, phenolic acid apcilymers, melamine resins, epoxy resins, saturated polyesters, thermosetting polyurethanes, co-polymers and halogen-containing derivatives thereof, foamed polyurethanes, foamed polystyrenes, polyvinylchlorides and combinations thereof.

13. A bulk absorber for absorbing RF radiation of claim 11, wherein the particles are made of a magnetic or dielectric material selected from the group consisting of Fe, Co, Ni, Cr, rare-earth metals, various ferrites, such as ferrites of type $MFe_2O_4$ (where M=Mn, Ni, Cu), Ni—Zn ferrite, barium hexaferrite, iron-nickel alloys, iron-cobalt alloys, alloys based on rare-earth metals Nd—Fe—B, Sm—Co, Fe—B—Co—R (where R is a rare-earth element), or a combination thereof.

14. A three-dimensional composite material for use as a radio wave concentrator within the frequencies from 10 kHz to 100 GHz, the composite material comprising in combination:

magnetic or dielectric nanoparticles having a diameter of about 1 nanometer to 100 micron of a material selected from Fe, Co, Ni, Cr, rare-earth metals, various ferrites, such as ferrites of type $MFe_2O_4$ (where M=Mn, Ni, Cu), Ni—Zn ferrite, barium hexaferrite, iron-nickel alloys, iron-cobalt alloys, alloys based on rare-earth metals Nd—Fe—B, Sm—Co, Fe—B—Co—R (where R is a rare-earth element), or a combination thereof, and a porous polymer open cell foam substrate, having interconnected open-pore cavities of a diameter of 10 to 100 micron, wherein the inner surface of the pores is electroconductive due to magnetic nanoparticles coating the walls of the porous polymer substrate, the amount of nanoparticulate material coated on the substrate being in the range from 2 to 25% based on weight of said substrate, wherein the said polymer foam is coating the surface of a magnetic coil, and the nanoparticles are aligned in continuous conductive lines, which form within the polymer substrate a three-dimensional pattern having at least one characteristic dimension selected from the width and length of the said conductive line, which is proportional to at least one wave length or lengths of the said electromagnetic radiation within the frequencies from 10 kHz to 100 GHz.

* * * * *